(12) United States Patent
Delacruz et al.

(10) Patent No.: US 12,154,858 B2
(45) Date of Patent: Nov. 26, 2024

(54) CONNECTING MULTIPLE CHIPS USING AN INTERCONNECT DEVICE

(71) Applicant: Invensas LLC, San Jose, CA (US)

(72) Inventors: Javier A. Delacruz, San Jose, CA (US); Belgacem Haba, Saratoga, CA (US)

(73) Assignee: Invensas LLC, San Jose, CA (US)

( * ) Notice: Subject to any disclaimer, the term of this patent is extended or adjusted under 35 U.S.C. 154(b) by 81 days.

(21) Appl. No.: 16/905,766

(22) Filed: Jun. 18, 2020

(65) Prior Publication Data

US 2020/0402913 A1    Dec. 24, 2020

Related U.S. Application Data

(60) Provisional application No. 62/863,367, filed on Jun. 19, 2019.

(51) Int. Cl.
*H01L 23/48* (2006.01)
*H01L 23/00* (2006.01)
(Continued)

(52) U.S. Cl.
CPC ...... *H01L 23/5386* (2013.01); *H01L 23/5384* (2013.01); *H01L 24/08* (2013.01);
(Continued)

(58) Field of Classification Search
CPC . H01L 2224/10–11; H01L 2224/80895; H01L 2224/09183;
(Continued)

(56) References Cited

U.S. PATENT DOCUMENTS

| 5,418,687 A | 5/1995 | Chen |
| 7,485,968 B2 * | 2/2009 | Enquist .................. H01L 25/50 438/455 |

(Continued)

FOREIGN PATENT DOCUMENTS

| KR | 20170109865 A | 10/2017 |
| WO | 2016036667 A1 | 3/2016 |

OTHER PUBLICATIONS

International Search Report and Written Opinon for PCT Application PCT/US2020/038642 dated Oct. 7, 2020, a counterpart foreign application for U.S. Appl. No. 16/905,766, pp. 1-pp. 13.

*Primary Examiner* — Hoa B Trinh
(74) *Attorney, Agent, or Firm* — Haley Guiliano LLP

(57) ABSTRACT

Techniques are disclosed herein for connecting multiple chips using an interconnect device. In some configurations, one or more interconnect areas on a chip can be located adjacent to each other such that at least a portion of an edge of a first interconnect area is located adjacent to an edge of a second interconnect area. For example, an interconnect area can be located at a corner of a chip such that one or more edges of the interconnect area lines up with one or more edges of an interconnect area of another chip. The chip including at least one interconnect area can also be positioned and directly bonded to the interconnect device using other layouts, such as but not limited to a pinwheel layout. In some configurations more than one interconnect area can be included on a chip.

23 Claims, 9 Drawing Sheets

(51) Int. Cl.
*H01L 23/538* (2006.01)
*H01L 25/10* (2006.01)

(52) U.S. Cl.
CPC .............. *H01L 24/09* (2013.01); *H01L 24/80* (2013.01); *H01L 25/105* (2013.01); *H01L 2224/08137* (2013.01); *H01L 2224/08225* (2013.01); *H01L 2224/09183* (2013.01); *H01L 2224/80895* (2013.01)

(58) Field of Classification Search
CPC ... H01L 2224/08137–08225; H01L 24/08–13; H01L 24/80–82
See application file for complete search history.

(56) References Cited

U.S. PATENT DOCUMENTS

| | | |
|---|---|---|
| 8,742,576 B2 | 6/2014 | Thacker et al. |
| 9,472,529 B2 | 10/2016 | Vora |
| 9,666,559 B2 | 5/2017 | Wang et al. |
| 9,716,033 B2 | 7/2017 | Enquist et al. |
| 11,387,214 B2 | 7/2022 | Wang et al. |
| 11,398,258 B2 | 7/2022 | Fisch |
| 2009/0089466 A1* | 4/2009 | Cunningham .......... H01L 25/18 710/100 |
| 2013/0207261 A1* | 8/2013 | Thacker ................. H01L 24/90 257/738 |
| 2015/0255417 A1* | 9/2015 | Farooq .................... H01L 24/94 257/620 |
| 2016/0027761 A1 | 1/2016 | Co et al. |
| 2018/0130784 A1 | 5/2018 | Pagani |
| 2018/0337129 A1 | 11/2018 | Li et al. |
| 2019/0006316 A1* | 1/2019 | Yu ........................... H01L 25/50 |
| 2019/0318984 A1* | 10/2019 | Kim .................. H01L 23/49805 |
| 2019/0371778 A1* | 12/2019 | Sankman ................ H01L 24/06 |
| 2020/0312767 A1* | 10/2020 | Pietambaram .... H01L 23/49822 |

\* cited by examiner

CONNECTING MULTIPLE CHIPS USING AN INTERCONNECT DEVICE

RELATED APPLICATIONS

This application claims the benefit of priority to provisional U.S. Patent Application Ser. No. 62/863,367, filed on Jun. 19, 2019, and entitled "Connecting Multiple Chips Using an Interconnect Device", which is incorporated by reference in entirety.

BACKGROUND

Today, integrated circuits (ICs) are utilized in almost all electronic equipment. Computer devices, mobile electronic devices, and other electronic devices are made possible by the small size and low cost of ICs. In order to increase the density of ICs, multiple ICs are located on a multi-chip module (MCM). An MCM refers to an electronic assembly where multiple ICs, semiconductor dies, and/or other discrete components are integrated, usually onto a unifying substrate.

As IC technology continues to scale, it is increasingly difficult for existing interconnection technologies to meet the demands of chip manufacturers for characteristics such as high bandwidth, low power, good heat dissipation, reliability and low cost. Further, it can be difficult to align the different components of the components in MCMs.

DETAILED DESCRIPTION

Figure 1:
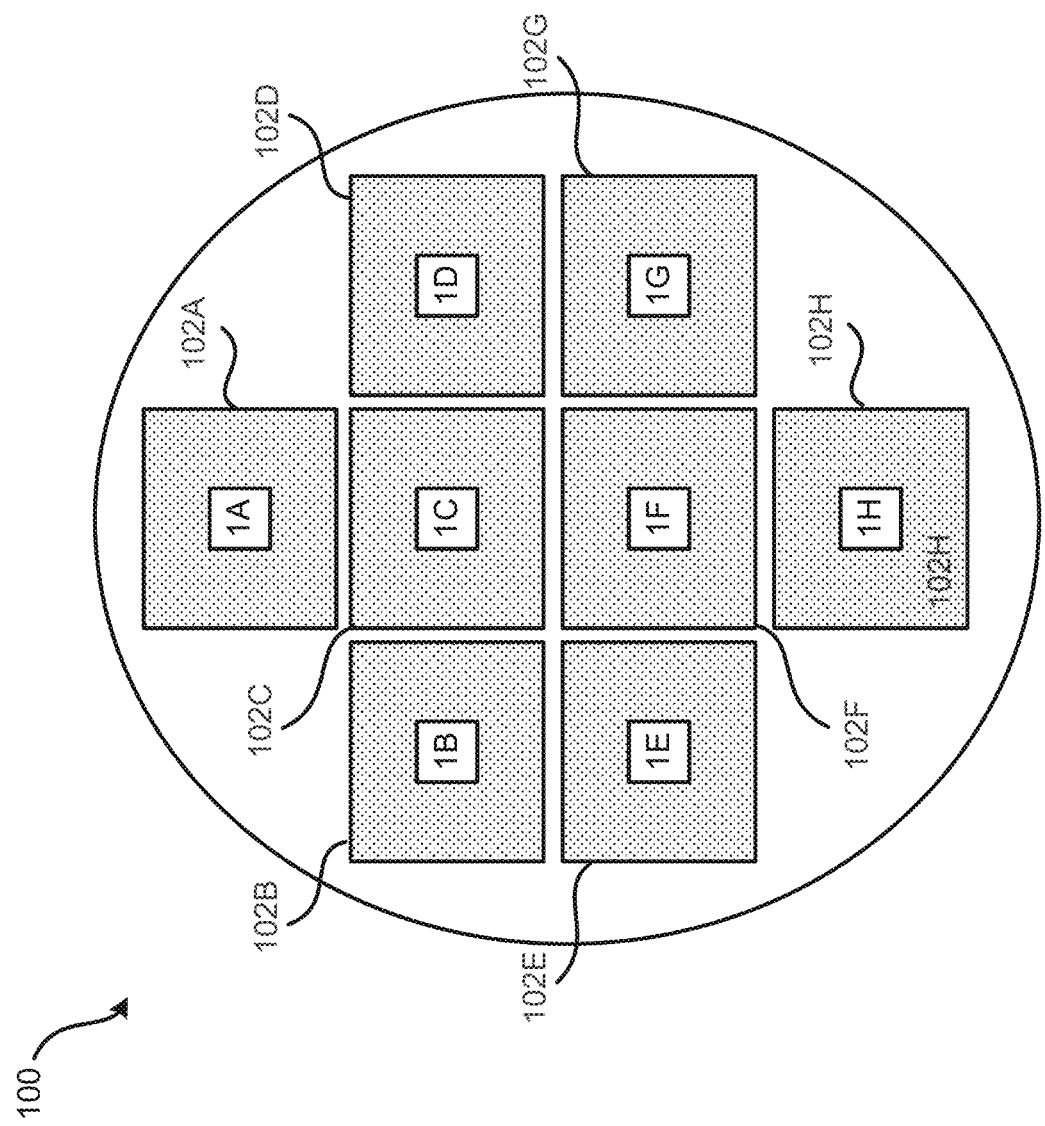
FIG. 1 is a schematic diagram depicting illustrative embedded dies as active bridges in a wafer format.

The following detailed description is directed to technologies for connecting multiple chips (which may also be referred to herein as "dies") using an interconnect device. Generally, a die is a block of semiconducting material that contains one or more circuits configured to perform one or more functions. Interconnects may be used to connect and create electrical connections between different electrical circuits on the chips/dies. The interconnects can include signaling interconnects that can be utilized for communications between the electrical circuits, and/or power interconnects that can be utilized to provide power to the different electrical circuits. The interconnect devices described herein provide an electrical interconnect between different dies such that the connections may provide high bandwidth signaling.

According to some configurations, the dies may be connected using interconnect areas that have smaller pitches compared to existing technologies. For instance, in some configurations, the pitches utilized by the interconnect devices may be very small (e.g., 2 μm-10 μm). These pitches are much smaller compared to existing technologies that are generally larger than 50 μm.

In some configurations, adjacent chips/dies can be located such that an interconnect area of a first chip is located adjacent to another interconnect area of a second chip. As used herein, an "interconnect area" is a portion of a chip that is to be bonded to a portion (e.g., a "bonding area") of the interconnect device. A chip may include more than one interconnect area and the interconnect area(s) may be located at various locations on a chip. In some configurations, a chip includes an interconnect area at a corner of the chip. In other configurations, the interconnect area may be at other locations on a chip. For example, an interconnect area may be adjacent to an edge of a chip. In yet other configurations, more than one interconnect area may be included on a chip. For instance, a chip may include an interconnect area on both a first edge of a chip and a second edge of a chip. The interconnect areas may also be located at other locations on the chip, such as anywhere on the chip.

As briefly discussed, a first interconnect area can be located at a corner of a first chip such that one or more edges of the first interconnect area lines up with one or more edges of a second interconnect area of a second chip when positioned on the interconnect device. According to some configurations, four chips are connected to the interconnect device using interconnect areas that are located at the corners of the chips. The chips including at least one interconnect area can also be positioned using other layouts, such as but not limited to a pinwheel layout.

The interconnect device acts as a "bridge" (e.g., passive or active) that connects a plurality of chips together. An active interconnect device includes active circuits to enhance signals, whereas passive interconnect devices do not include active circuits for enhancing signals. In some configurations, the interconnect device allows interconnect area(s) of a chip to be bonded to the interconnect device using Direct Bond Interconnect (DBI)® technology. Pitches using DBI can be much smaller compared to flip chip connections, but bonding alignment can be more difficult compared to flip chip. DBI® is a low temperature hybrid direct bonding technology that allows chips to be bonded with exceptionally fine pitch 3D electrical interconnect. In some examples, the DBI alignment and bonding process may be performed at room temperature without using adhesives.

In some configurations, the interconnects may be referred to as "direct-bonded native interconnects" that are metal-to-metal bonds formed directly between native conductors of a die and conductors of a second die, thereby forgoing the need for the complexity and overhead of standard interfaces. A native conductor of a die is an electrical conductor that has electrical access to the raw or native signal of the die, operational at the level of the core functional logic of the particular die, without significant modification of the signal for purposes of interfacing with other dies. The native interconnects for conducting such native signals from the core-side of a die can provide continuous circuits disposed through two or more cross-die boundaries without amplifying or modifying the native signals, except as desired to accommodate dies from different manufacturing processes. From a signal standpoint, the native signal of the IP core of one die is passed directly to other dies via the directly bonded native interconnects, with no modification of the native signal or negligible modification of the native signal, thereby forgoing standard interfacing and consortium-imposed input/output protocols. For instance, the native interconnects described in U.S. Pat. No. 10,522,352, issued Dec. 31, 2019, entitled "Direct-Bonded Native Interconnects and Active Base Die", which is incorporated by reference in its entirety, may be utilized according to some configurations.

During processing, dielectric surfaces, such as silicon oxide and silicon carbide nitride, with embedded metal bond pads, typically of copper or nickel, may be polished to achieve minimal surface roughness. Simultaneously, the metal bond pads may be slightly dished or recessed. Polishing and dishing may be achieved using standard chemical mechanical polishing (CMP) tools. In some examples, nitrogen-based chemistries may then be applied through conventional plasma etch tools. Prepared chips can then be simply aligned and placed together resulting in the spontaneous formation of strong chemical bonds between the prepared surfaces.

After a moderate batch anneal, the conductive bond pads expand into one another to form a homogeneous metallic interconnect with grain growth across the bond interface. Concurrently, the chemical bond between oxides is significantly strengthened, ensuring high reliability without using under-fill. This process leverages industry-standard wafer bonding equipment. Hybrid bonding can also reduce the need for Thru Silicon Vias (TSVs) by allowing interconnection to occur at the bonding surface, improving electrical performance. In some examples, under-fill may not be utilized while still providing excellent thermal performance, reliability and hermeticity. Additional details regarding the various technologies and processes described above will be presented below with regard to FIGS. 1-8.

In the following detailed description, references are made to the accompanying drawings that form a part hereof, and that show examples by way of illustration. The drawings herein are not drawn to scale. Like numerals represent like elements throughout the several figures (which may be referred to herein as a "FIG." or "FIGS.").

FIG. 1 is a schematic diagram 100 depicting illustrative embedded dies 1A, 1B, 1C, 1D, 1E, 1F, 1G, and 1H as active or passive bridges. As illustrated, a carrier includes a plurality of dies 1A, 1B, 1C, 1D, 1E, 1F, 1G, and 1H that act as active or passive bridges (shown as a square of a solid fill). In some configurations, the devices on the carrier may be coupled electronically using one or more technologies. For example, one or more of the devices on the carrier may be connected via arrays as pass-throughs at flip chip pitch, and the like. Generally, a flip chip connection is a technique for interconnecting semiconductor devices, such as IC chips to other circuitry with solder bumps that have been deposited onto chip pads. Pitches utilizing this process are typically 150 μm or greater. Other techniques can also be utilized to couple different chips, such as Embedded Multi-die Interconnect Bridge (EMIB), which makes use of silicon with routing layers that connects one chip to another. Conventional EMIB, however, cannot handle a very fine pitch, like DBI. As discussed briefly above, using techniques described herein the pitches may be less than 10 μm. According to some examples, the dies may be embedded in a wafer or panel form.

DBI bonding may be utilized for fine-pitch bonding in integrated circuit assembly, and can be applied to bond the die to the interconnect area. See for example, U.S. Pat. No. 7,485,968, which is incorporated by reference herein in its entirety. DBI bonding technology has also been demonstrated down to lower pitches in wafer-to-wafer approaches that do not have this individual die pitch limitation with the pick-and-place (P&P) operation (Pick & Place surface-mount technology machines). With DBI technology, under bump metalization (UBM), underfill, and micro-bumps are replaced with a DBI metalization layer. Bonding at die level is initiated at room temperature followed by a batch anneal at low temperature. ZiBond® direct bonding may also be used in some circumstances ((Ziptronix, Inc., an Xperi Corporation company, San Jose, Calif.).

The areas outside of the active bridges, including areas 102A, 102B, 102C, 102D, 102E, 102F, 102G, and 102H (shown as a dotted patterned area outside of the solid color square), are formed as interposers around the bridges 1A, 1B, 1C, 1D, 1E, 1F, 1G, and 1H. The dots in the fill pattern represent pass-thru vias for signals on the die. The edges of areas 102A, 102B, etc. generally define a dicing lane for separating the devices. During dicing, the dies may be mounted on dicing tape which has a sticky backing that holds the dies on a thin sheet metal frame. The dicing tape may have different properties depending on the dicing application. In some examples, there may also be a redistribution pattern in the regions outside of the bridges.

The following figures illustrate example techniques for connecting multiple chips using an interconnect device. As the following figures illustrate, core level connections can extend through an interconnect area on one chip to one or more interconnect areas of one or more other chips. This can result in creating devices that are larger than a single reticle. Generally, a reticle is a photomask used to transfer a circuit pattern onto wafers using a step-and-repeat system. Sometimes, however, circuits require an area greater than a maximum field size available in the step-and-repeat system for correct operation. These circuits may be referred to as "reticle limited." While some upcoming techniques, such as stitching of reticles, appear promising to create circuits larger than a reticle, these solutions are likely to be expensive.

Figure 2:
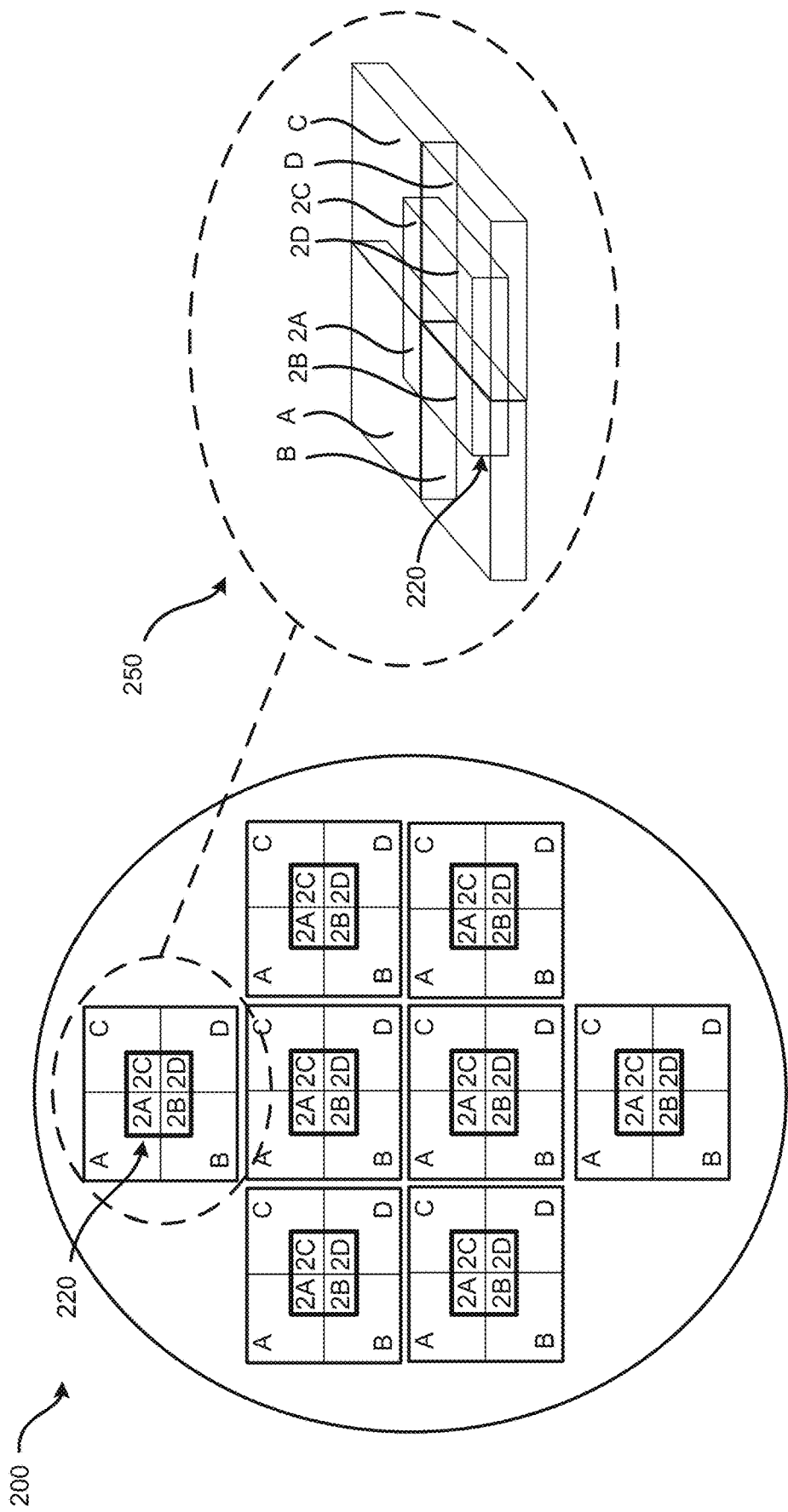
FIG. 2 is a schematic diagram depicting an illustrative layout of chips, that include interconnect areas on a corner of each chip, on an interconnect device.

FIG. 2 is a schematic diagram 200 depicting an illustrative layout of chips A, B, C, and D, that include interconnect areas 2A, 2B, 2C, and 2D that are located on a corner of each chip, disposed on and coupled to an interconnect device 220. As illustrated, the placements of the interconnect areas 2A, 2B, 2C, and 2D are disposed adjacent relative to each other. While the interconnect device 220 is illustrated as beneath the interconnect areas 2A, 2B, 2C, and 2D, the interconnect device 220 may be localised above interconnect areas 2A, 2B, 2C, and 2D in other configurations. The tolerance of the placement for the other areas of the chip are not as stringent as compared to alignment of the interconnect areas.

In some configurations, the interconnect areas 2A, 2B, 2C, and 2D are located at corners of the chips A, B, C, and D, such that one corner of one chip that also includes an interconnect area is lined up with one or more other chips that includes an adjacent interconnect area when positioned on an interconnect device. In the current example, interconnect area 2A of chip A and interconnect area 2C of chip C are on a bottom corner of a chip and interconnect areas 2B and 2D of chip B and chip D are on an upper corner of the chip. More specifically, interconnect area 2A is located on a lower right portion of chip A, interconnect area 2B is located on a upper right portion of chip B, interconnect area 2C is located on a lower left portion of chip C, and interconnect area 2D is located on a upper left portion of chip D.

Interconnect areas 2A, 2B, 2C, and 2D may all be interconnected using an interconnect device that is positioned on the interconnect areas. An interconnect device 220 is bonded to each of the interconnect areas 2A, 2B, 2C, and 2D. Device 220 is on a different plane from the plane that chips A, B, C, and D are located on.

As will be illustrated in FIG. 5 (discussed below), more than one interconnect area can be included on a chip. In this case, it can be more difficult positioning the interconnect area as there can be a tighter tolerance. In some configurations, outside of the interconnect area (e.g., outside of the area of the solid squares as illustrated in FIG. 2), the connections can be made using thru-dielectric vias, or some other technique. Generally, a "via" is a small opening that allows a conducting connection between different layers of an integrated circuit. Many vias are referred to as a through-silicon via (TSV) that passes through vertical layers of a silicon wafer or die. TSVs may be performance interconnect techniques used as an alternative to wire-bond and flip chips to create three-dimensional (3D) integrated circuits.

These direct pass throughs may already exist at the existing flipchip-level pitch already on the chip. Different connections on a given chip may have different interconnect characteristics. For example, the pass through connections may be of a size and/or pitch that is greater than the size and/or pitch of connections made between the chip and the interconnect device.

In some configurations, the chips that are bonded to the interconnect device 220 can be positioned on a carrier, such as an inexpensive carrier. In other examples, the chips and bonded interconnect device are not positioned on a substrate or carrier. Generally, any carrier can be utilized that meets the requirements of the project. For example, the carrier may be selected such that the carrier withstands temperatures for oxide deposition and anneal. Some example materials can be, but are not limited to plastic, glass with etched cavity and filled with oxide or other, Benzocyclobutene (BCB) wafer, molded in liquid crystal polymer (LCP), other inorganic wafer materials such as polyimide (PI), Photosensitive polyimide (PBO), and the like.

Indicator 250 illustrates an enlarged perspective view that shows chip A that includes interconnect area 2A bonded to a first corner portion of the interconnect device 220. Chip B that includes interconnect area 2B is bonded to a second corner portion of the interconnect device 220. Chip C that includes interconnect area 2C is bonded to a third corner portion of the interconnect device 220. Chip D that includes interconnect area 2D is bonded to a fourth corner portion of the interconnect device 220. While interconnect device 220 is illustrated below chips A, B, C, and D, the interconnect device 220, according to some examples, may be bonded to a top surface of chips A, B, C, and D. As discussed above, in some examples, the interconnect areas 2A, 2B, 2C, and 2D are bonded to the interconnect device 220 using DBI technology. In other examples, other bonding techniques can be utilized. As can be seen in 250, the interconnect device 220 can be bonded to the chips without a need for a substrate.

Figure 3:
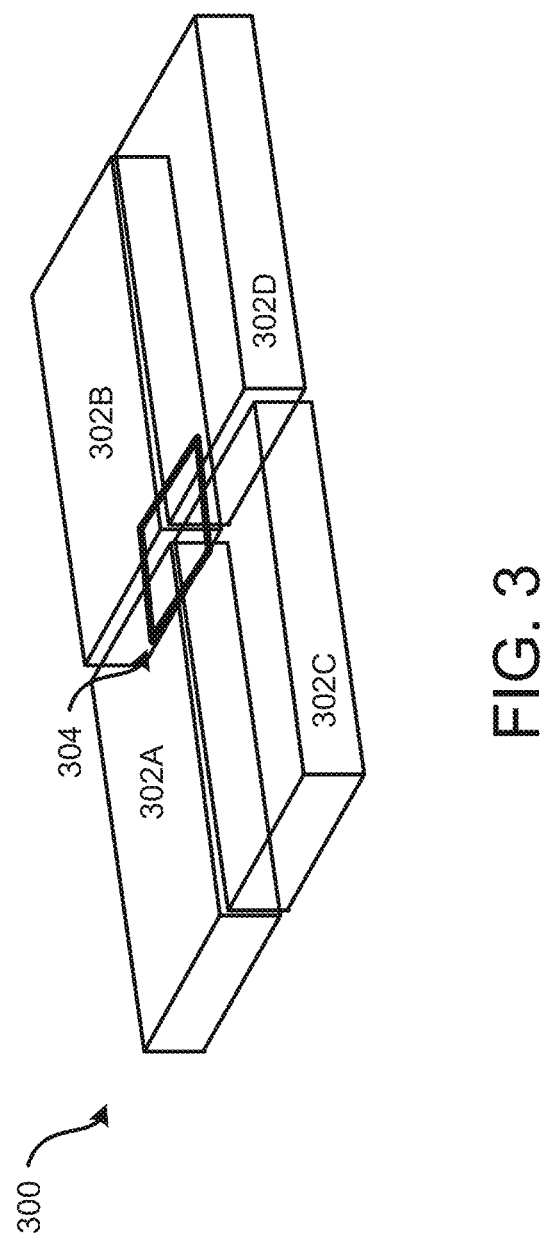
FIG. 3 is a schematic diagram depicting an illustrative example in which multiple chips utilize an interconnect device that forms a combined footprint area that is larger than a reticle.

FIG. 3 is a schematic diagram 300 depicting an illustrative example in which multiple chips utilize an interconnect device to create a combined device that forms a combined footprint area that is larger than a reticle. As illustrated, each chip 302A, 302B, 302C, and 302D may approach the size of a reticle. In the current example, once assembled, the device 300 reaches the equivalent of up to four reticles. The device 300 may be smaller or larger using techniques described herein. In some configurations, a fill between the chips may be included.

By including an interconnect area, such as interconnect area 304, that is at the corners of each chip, core level connections can extend through the interconnect area on one chip to one or more interconnect areas of one or more other chips. In the current example, this results in creating a combined device that approaches 4 reticles.

While area 304 is shown for interconnect area, the interconnect area may be at other locations, and/or may be formed differently (e.g., rectangle, square, circular, . . . ). For example, the interconnect area may be along the edges of the chips that are adjacent to each other as illustrated in other FIGURES herein. Moreover, the interconnect area 304 may be of various sizes including the size of a reticle. Multiple such interconnect areas 304 may be positioned relative to chips 302A, 302B, etc.

Figure 4:
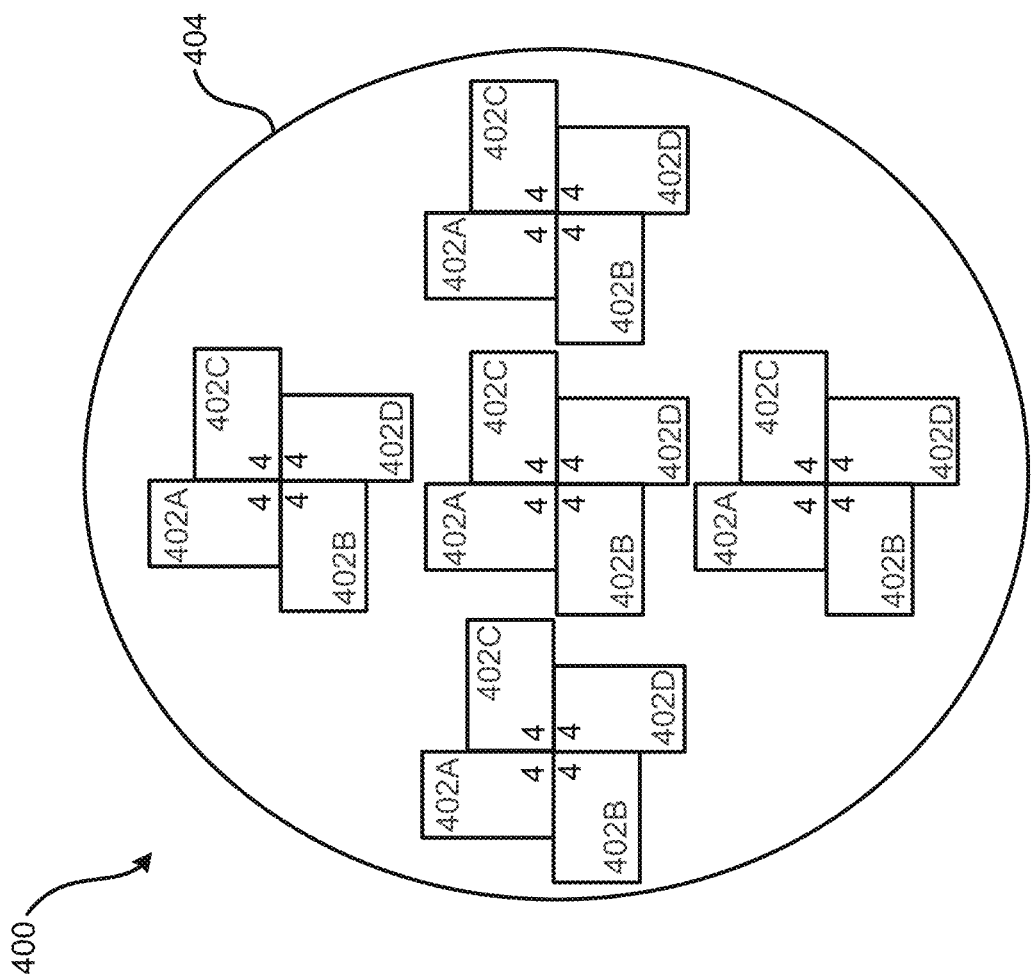
FIG. 4 is a schematic diagram depicting an illustrative pinwheel layout of chips on an interconnect device.

FIG. 4 is a schematic diagram 400 depicting a pinwheel layout of chips on an interconnect device 404. As illustrated, the chips 402A, 402B, 402C, and 402D are rectangular shaped chips where a long side of one chip is rotated 90 degrees to a short side of another chip in each placement such that the core routing is included in a single corner (4) of a reticule tile. Instead of locating the interconnect area on different corners of the chips as illustrated in FIG. 2, each chip 402A, 402B, 402C, and 402D includes an interconnect area 4 that is located at the same corner of a chip as the other chips. By rotating the chips 90 degrees in each placement the interconnect area 4 lines up with each other. In other configurations, this technique may apply to 2-die, 3-die, 6-die or 8-die, configurations. For instance, in 2-die, formats, there is one edge per die that uses the bridge.

Figure 5:
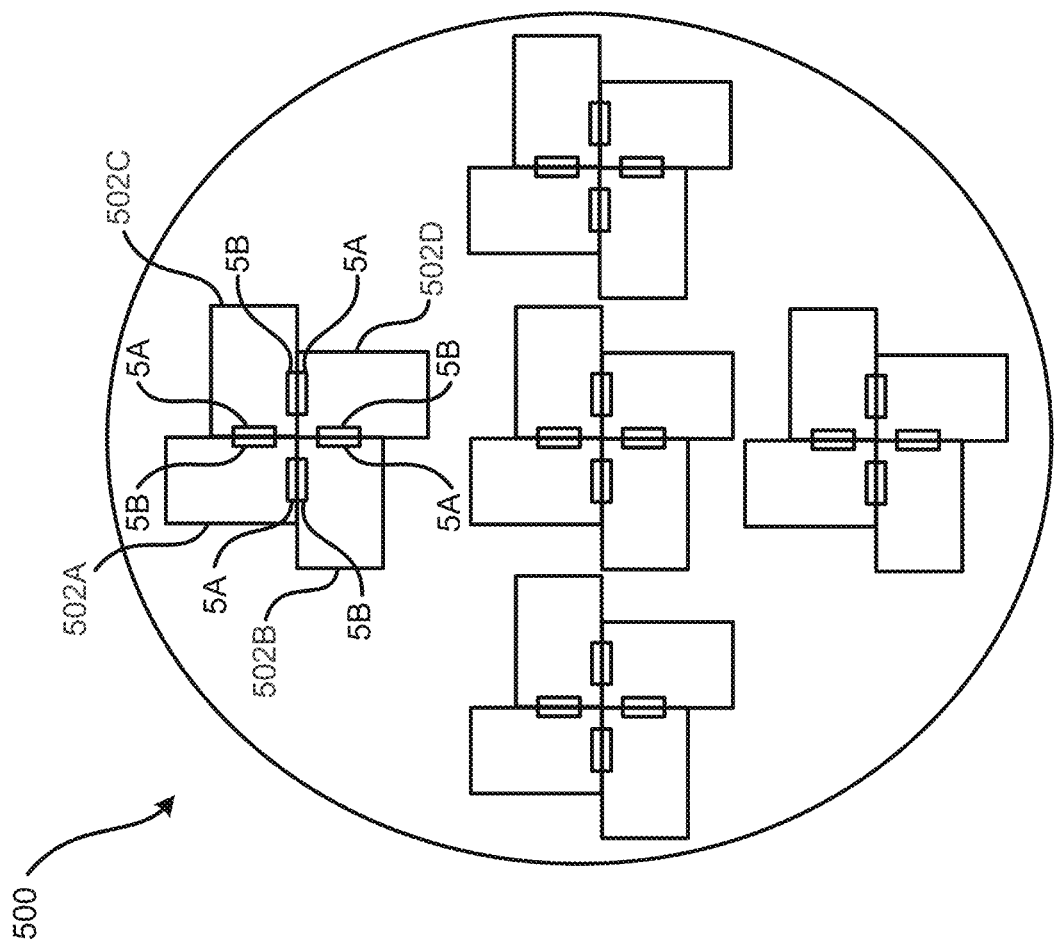
FIG. 5 is a schematic diagram depicting an illustrative layout of chips including multiple interconnect areas and multiple interconnect devices.

FIG. 5 is a schematic diagram 500 depicting a layout of chips 502A, 502B, 502C, and 502D including multiple interconnect areas 5A and 5B and multiple interconnect devices. As illustrated, FIG. 5 shows multiple interconnect areas 5A and 5B (that may be smaller than a single interconnect area) that may reduce die size but may be more difficult to position since the placement of the multiple interconnect areas may utilize higher accuracy in placement. As illustrated, individual chips 502A, 502B, 502C, and 502D include first interconnect areas 5A and a second interconnect areas 5B that are located on different edges of the chips. In some examples, the interconnect areas 5A, 5B may be different sizes (e.g., interconnect area 5A has a size that is smaller than interconnect area 5B, or some other size). By rotating each chip 502A, 502B, 502C, and 502D during placement, interconnect area 5A of one chip is aligned with interconnect area 5B on an adjacent chip.

Figure 6A:
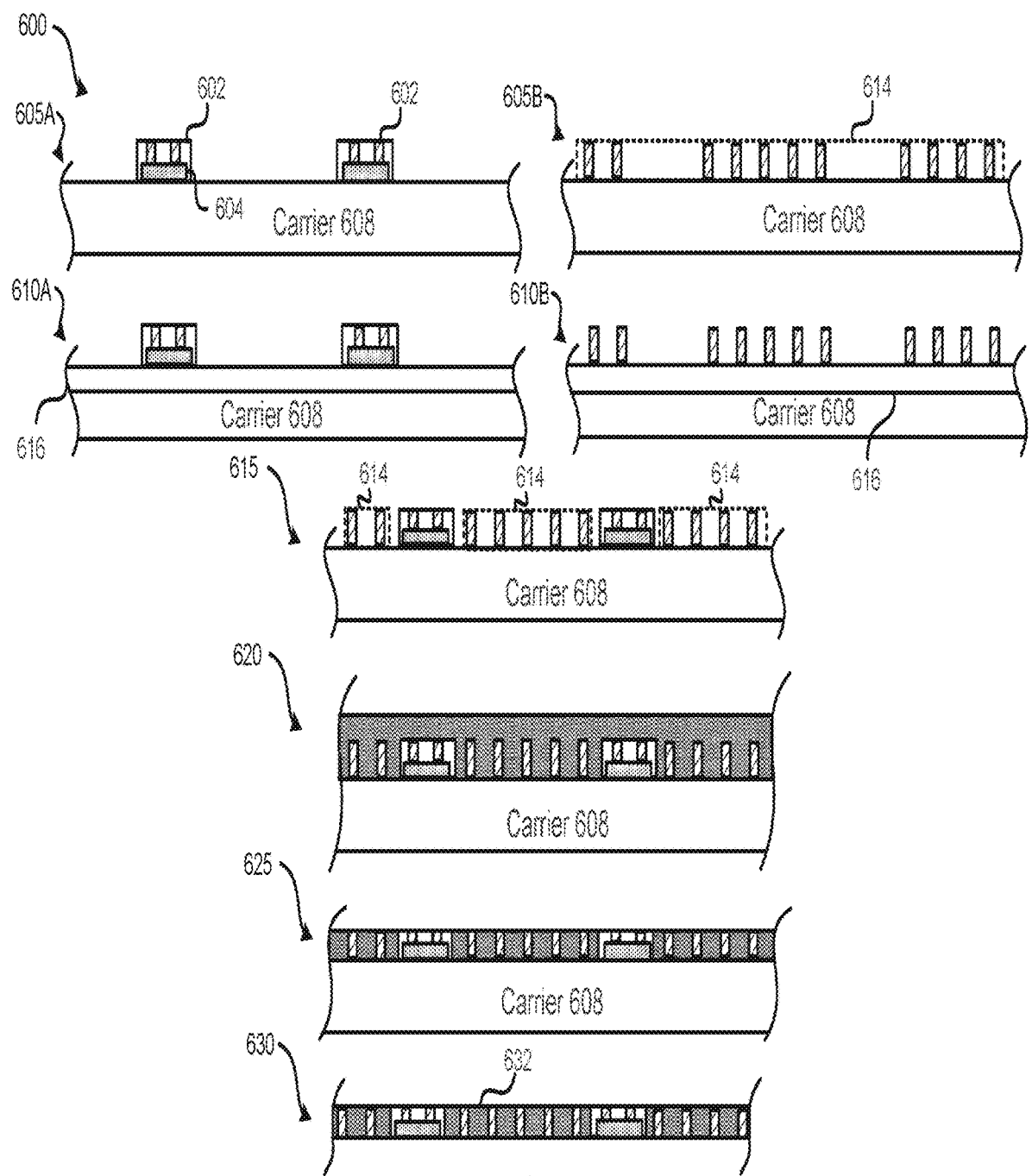
FIGS. 6A-6B are schematic diagrams depicting an illustrative process flow for multiple chips per interconnect device.
Figure 6B:
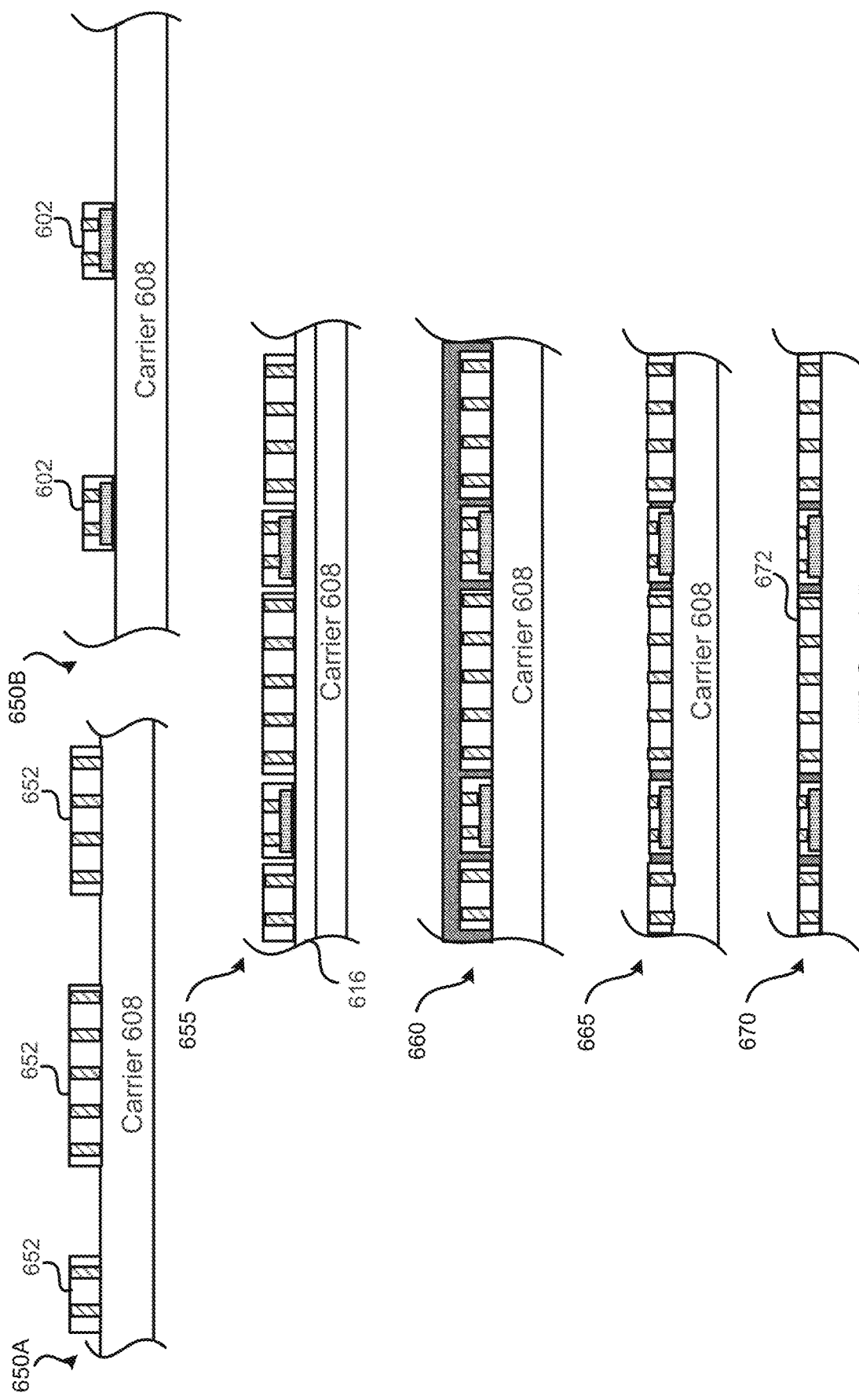

FIGS. 6A and 6B are schematic diagrams depicting illustrative process flows 600, 650 for multiple chips per interconnect device. FIG. 1 shows an example of embedded dies that may be created using the processes of FIGS. 6A and 6B. Process 600 illustrates a flow for patterning of posts that may serve as the interconnects.

As illustrated, dies 602 include an interconnect area 604 that may be utilized for high bandwidth signaling. In the example illustrated in 605A, the dies 602 may be placed on a carrier 608 before forming conductive posts 614. According to some examples, the carrier 608 is rigid and can be bumped either before or after and can have additional metalization/routing before bonding that remains after carrier removal or additional metalization can be done after carrier removal. In some configurations, a fill between the chips may be included.

In other examples, such as illustrated in 605B, the dies 602 may be placed on a carrier 608 after forming conductive posts 614. According to some configurations, instead of placing the dies 602 and forming the conductive posts 614 on the carrier 608, the dies 602 and the conductive posts 614 may be placed onto a layer 616, such as a redistribution layer (RDL) layer, or patterned metal and dielectric layer(s) as illustrated in 610A, and 610B. Generally, the layer 616 may be one or more layers (e.g., metal) that include wiring that makes the input/output (I/O) pads of the die available in other locations of the chip.

After placing the dies 602 and forming the conductive posts 614 on the carrier 608 or the layer 616, they may be encapsulated as illustrated at 620, with a low coefficients of thermal expansion (CTE) material, such as but not limited to liquid crystal polymer (LCP) SiO2, polysilicon (polySi), metal, and the like. Generally, LCP is a high-performance thermoplastic material with excellent thermomechanical behavior. At 625 the layer above the TSVs may be thinned to expose the tips of the posts, and at 630 the carrier 608 removed that shows an structure 632 that includes pass through interconnects in regions not occupied by the interconnect devices. In some examples, patterned metal and dielectrics that were present on the carrier prior to bonding may remain.

In addition to the illustrative processes, other techniques can be utilized. For example, metallization can be added to the carrier that may serve as an alignment feature. DBI chiplets can be utilized for pass-through devices, and after debond may have pads for bumping.

FIG. 6B is similar to FIG. 6A but illustrates utilizing preformed tiles of vias 652. In the example illustrated in 650A, the tiles of vias 652 may be prepackaged and placed on a carrier 608 before placing the dies 602. In other examples, the dies 602 may be placed on a carrier 608 before placing the tiles of vias 652 as illustrated in 650B. According to some configurations, instead of placing the dies 602 and the tiles of vias 652 on the carrier 608, the dies 602 and the tiles of vias 652 may be placed onto layer 616 (e.g., metalization, patterned, RDL) as illustrated in 655. After placing the dies 602 and the tiles of vias 652 on the carrier 608 or the layer 616, they may be encapsulated as illustrated at 660, with a low coefficients of thermal expansion (CTE) material, such as but not limited to liquid crystal polymer (LCP) SiO2, polysilicon (polySi), metal, and the like. At 665 the layer above the tiles of vias 652 may be etched to expose the tips of the posts, and at 670 the carrier 608 removed that shows an structure 672 that includes pass through interconnects in regions not occupied by the interconnect devices.

Figure 7:
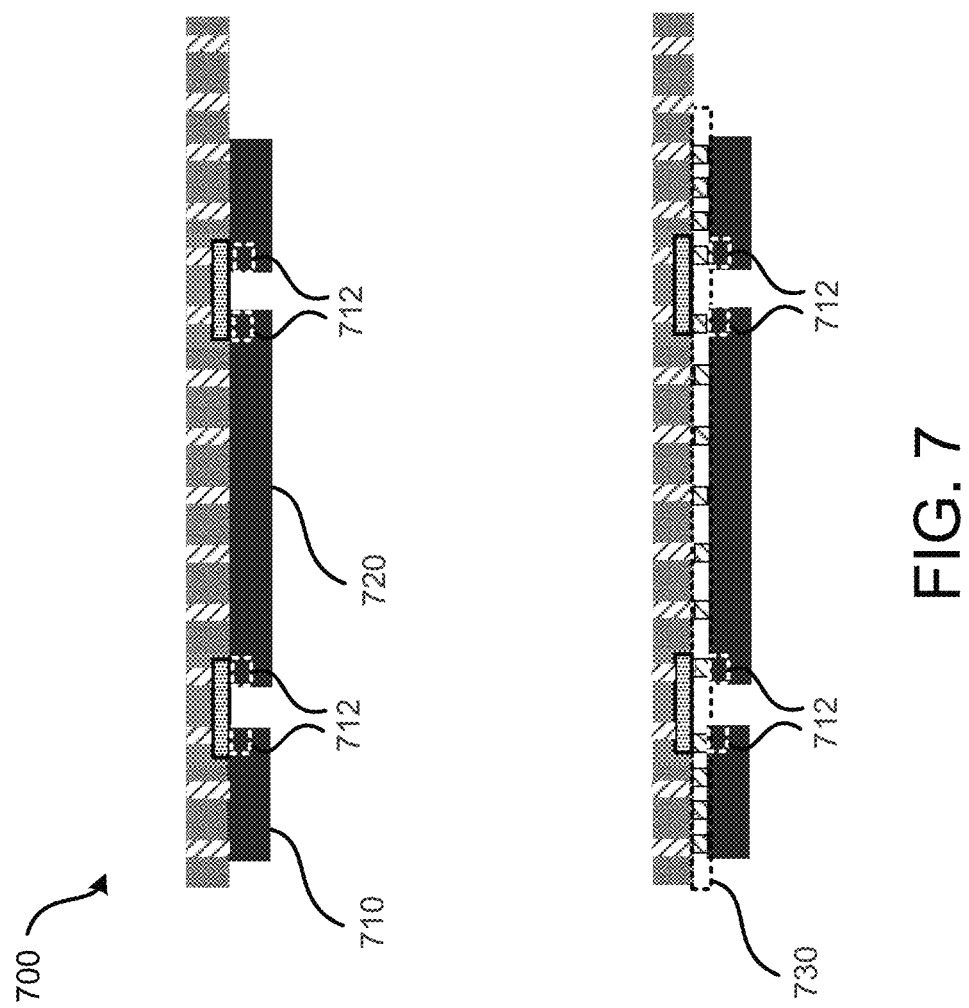
FIG. 7 is a schematic diagram depicting illustrative 2.5D solutions.

FIG. 7 is a schematic diagram 700 depicting illustrative 2.5D solutions. As illustrated, FIG. 7 depicts an example High Bandwidth Memory (HBM) 710 and example logic 720. These devices can be integrated in a lower cost interposer using techniques illustrated and described. Subsequent bumping may use gap-filling with Coefficient of Thermal Expansion (CTE) materials that are generally matched (e.g., <10 ppm/° C., <15 ppm/° C., . . . ) by encapsulation, evaporation, Atomic layer deposition (ALD), Chemical vapor deposition (CVD), Physical vapor deposition (PVD), spin-on, squeege on, compression mold, transfer mold, vacuum assisted mold and the like. Additionally, conventional interconnects such as micropillars 730 can be utilized. As discussed above, the interconnect areas 712 are much finer pitch (e.g., such as 2 μm-10 μm) compared to other interconnect technologies.

Figure 8:
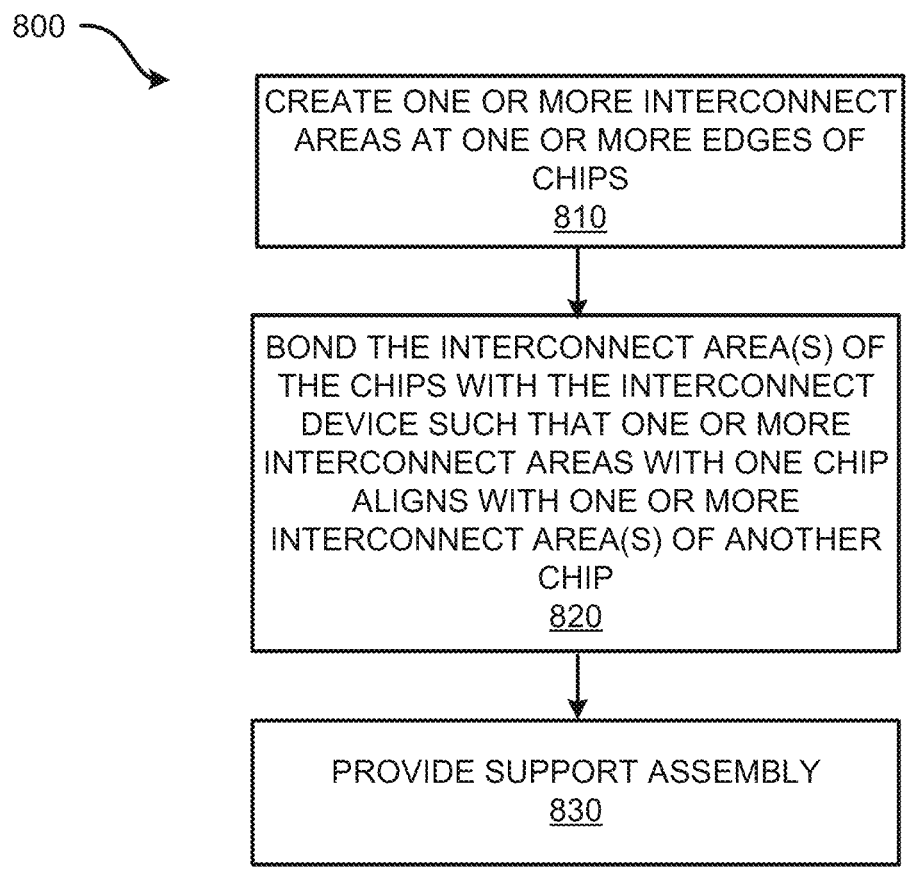
FIG. 8 is a flow diagram of illustrative techniques for utilizing an interconnect device to connect multiple chips.

FIG. 8 is a flow diagram of an illustrative techniques for utilizing an interconnect device to connect multiple chips in accordance with examples described herein.

The process 800 may include, at 810, creating one or more interconnect areas at one or more edges of a device. At 820, the one or more edges of the one or more interconnect areas are aligned, positioned, and bonded with the interconnect device 220. As discussed above, one or more of the interconnect areas of one chip are aligned with one or more interconnect areas of one or more other chips. At 830, a carrier may be utilized to provide support for the chips.

The logical operations described herein (e.g., with reference to FIGS. 6-8) are referred to variously as operations, structural devices, acts, or modules. These operations, structural devices, acts, and modules may be implemented using different techniques or procedures. It should also be appreciated that more or fewer operations may be performed than shown in the FIGS. and described herein. These operations may also be performed in parallel, or in a different order than those described herein.

Based on the foregoing, it should be appreciated that example technologies for connecting multiple chips using an interconnect device have been described. The subject matter described above is provided by way of illustration only and should not be construed as limiting. Furthermore, the claimed subject matter is not limited to implementations that solve any or all disadvantages noted in any part of this disclosure. Various modifications and changes may be made to the subject matter described herein without following the examples and applications illustrated and described, and without departing from the spirit and scope of the following claims.

What is claimed is:

1. A device comprising:
   at least three chips, each comprising a surface,
   each surface comprising a corner portion having a smaller area than each respective surface and each corner portion comprising an interconnect area, each interconnect area being disposed adjacent to an interconnect area of one or more of the other chips; and
   an interconnect device disposed over and directly bonded to only the corner portion of the surface of each of the at least three chips
   wherein:
       each of the interconnect areas is directly bonded to a respective portion of the interconnect device without an intervening adhesive, and the direct bonds comprise hybrid bonds; and
       each of the at least three chips is in electrical communication with an adjacent chip through a plurality of interconnects between the interconnect areas and the respective portions of the interconnect device disposed thereover.

2. The device of claim 1, wherein each of the interconnect areas has an interconnect pitch of less than twenty microns.

3. The device of claim 1, wherein:
   each of the interconnect areas is a first interconnect area;
   the first interconnect areas have pads of a first size and a first pitch;
   each of the chips further comprises a second interconnect area that has pads of a second size and a second pitch;
   the second size is larger than the first size; and
   the second pitch is greater than the first pitch.

4. The device of claim 3, wherein the interconnect device is incorporated in a structure comprising pass-through interconnects in regions not occupied by the interconnect device, and the pads of the second size are coupled with the pass-through interconnects.

5. The device of claim 4, wherein the structure comprises at least one semiconductor or dielectric region, and the pass-through interconnects comprise vias that extend through the at least one semiconductor or dielectric region.

6. The device of claim 1, wherein the device comprises at least four chips, each comprising an interconnect area disposed adjacent to an interconnect area of one or more of the other chips.

7. The device of claim 1, wherein the interconnect device is incorporated in a structure, the structure comprises pass-through interconnects in regions not occupied by the interconnect device, and each of the chips comprises a plurality of second pads coupled with the pass-through interconnects.

8. The device of claim 1, wherein the device has a footprint area that is larger than a reticle used to form one or more of the chips.

9. The device of claim 1, wherein the at least three chips are disposed in a first plane, and the interconnect device is disposed in a different second plane.

10. The device of claim 1, wherein the interconnect device has a surface area that is less than a collective surface area of the at least three chips.

11. The device of claim 1, wherein a surface area of the interconnect device is less than a surface area of each of the at least three chips.

12. A device comprising:
an interconnect device comprising a first bonding area that is adjacent to a second bonding area and a third bonding area;
a first chip comprising a first surface, wherein the first surface comprises a first corner portion having a smaller area than the first surface and the first corner portion comprises a first interconnect area bonded to the first bonding area;
a second chip comprising a second surface, wherein the second surface comprises a second corner portion having a smaller area than the second surface and the second corner portion comprises a second interconnect area bonded to the second bonding area; and
a third chip comprising a third surface, wherein the third surface comprises a third corner portion having a smaller area than the third surface and the third corner portion comprises a third interconnect area that is bonded to the third bonding area, wherein:
the interconnect device overlaps the first, second, and third interconnect areas and is directly bonded to only the first, second, and third corner portions;
the first, second, and third interconnect areas are directly bonded to the first, second, and third bonding areas, respectively, without an intervening adhesive, and the direct bonds comprise hybrid bonds;
the first, second, and third interconnect areas each comprise a plurality of first pads having a pitch of less than nine microns; and
the first, second, and third interconnect areas are electrically connected through the interconnect device.

13. The device of claim 12, wherein:
the first chip is positioned on the interconnect device at a first orientation,
the second chip is positioned on the interconnect device at a second orientation that is rotated relative to the first chip such that the first interconnect area is adjacent to the second interconnect area, and
the third chip is positioned on the interconnect device at a third orientation that is rotated relative to the first chip such that the first interconnect area is adjacent to the third interconnect area.

14. The device of claim 12, wherein:
the first, second, and third interconnect areas each comprise a plurality of first pads;
the first, second, and third chips each comprise a plurality of second pads;
the plurality of second pads are each larger than the first pads; and
the plurality of second pads have a pitch that is greater than a pitch of the plurality of first pads.

15. The device of claim 14, wherein the first, second, and third interconnect areas are electrically connected to the interconnect device through native interconnects.

16. A device comprising:
an interconnect device that includes a first bonding area that is adjacent to a second bonding area;
a first chip comprising a first surface, wherein the first surface comprises a first corner portion having a smaller area than the first surface and the first corner portion comprises a first interconnect area that is bonded to the first bonding area; and
a second chip comprising a second surface, wherein the second surface comprises a second corner portion having a smaller area than the second surface and the second corner portion comprises a second interconnect area, wherein:
the interconnect device is directly bonded to only the first and second corner portions;
the first and second interconnect areas are directly bonded to the first and second bonding areas, respectively, without an intervening adhesive, and the direct bonds comprise hybrid bonds; and
the interconnect device is electrically connected to the first interconnect area and the second interconnect area,
the first and second interconnect areas have pads of a first size and a first pitch, the first pitch is less than nine microns,
the device comprises regions on the first and second chips that have pads of a second size and a second pitch,
the pads of the second size are larger than the pads of the first size,
the second pitch is greater than the first pitch,
the interconnect device is incorporated in a structure comprising pass-through interconnects in regions not occupied by the interconnect device, and
the pads of the second size are coupled with the pass-through interconnects.

17. A method of forming a device comprising at least three chips, each chip comprising a surface, each surface comprising a corner portion having a smaller area than each respective surface, and an interconnect device electrically connected to each of the at least three chips, the method comprising:
positioning the at least three chips so that an interconnect area of each corner portion is adjacent to an interconnect area of one of the other corner portions; and
directly bonding each of the interconnect areas to a respective portion of the interconnect device without an intervening adhesive to form electrical connections between the interconnect areas and the interconnect device, wherein the direct bonds comprise hybrid bonds, wherein the interconnect device is directly bonded to only the corner portion of the surface of each of the at least three chips.

18. The method of claim 17, wherein the interconnect areas of the at least three chips each comprise a plurality of electrical pads having a pitch less than twenty microns.

19. The method of claim 17, wherein the interconnect areas are each disposed proximate to an edge of their respective chip.

20. The method of claim 17, wherein:
each of the chips comprises first pads of a first size and a first pitch disposed in the interconnect area and second pads of a second size and a second pitch disposed outside of the interconnect area,
the second pads are larger than the first pads, and
the second pitch is greater than the first pitch.

21. The method of claim 20, wherein the interconnect device is incorporated within a structure, the structure comprises pass-through interconnects in regions not occupied by the interconnect device, and the method further comprises coupling the second pads with the pass-through interconnects.

22. The method of claim 21, further comprising forming vias in the structure that extend through at least one semiconductor or dielectric region.

23. A device comprising:
at least three chips, each comprising a surface,
each surface comprising a corner portion having a smaller area than each respective surface and each corner portion comprising an interconnect area, each interconnect area being disposed adjacent to an interconnect area of one or more of the other chips; and
an interconnect device directly bonded to the corner portion of the surface of each of the at least three chips and not directly bonded to a remaining portion of the surface of each of the three chips,
wherein:
each of the interconnect areas is directly bonded to a respective portion of the interconnect device without an intervening adhesive, and the direct bonds comprise hybrid bonds; and
each of the at least three chips is in electrical communication with an adjacent chip through a plurality of interconnects between the interconnect areas and the respective portions of the interconnect device disposed thereover.

* * * * *